(12) United States Patent  
Garabieta Artiagoitia et al.

(10) Patent No.: US 8,963,533 B2  
(45) Date of Patent: Feb. 24, 2015

(54) HIGH-VOLTAGE VOLTAGE DIVIDER AND CONNECTOR COMPRISING SAID DIVIDER

(71) Applicant: Arteche Lantegi Elkartea, S.A., Munguia (Vizcaya) (ES)

(72) Inventors: Inaki Garabieta Artiagoitia, Munguia (Vizcaya) (ES); Alfonso Montero Bouza, Munguia (Vizcaya) (ES)

(73) Assignee: Arteche Lantegi Elkartea, S.A. (ES)

( * ) Notice: Subject to any disclaimer, the term of this patent is extended or adjusted under 35 U.S.C. 154(b) by 99 days.

(21) Appl. No.: 13/716,273

(22) Filed: Dec. 17, 2012

(65) Prior Publication Data

US 2013/0169263 A1      Jul. 4, 2013

(30) Foreign Application Priority Data

Dec. 16, 2011    (EP) .................................... 11382381

(51) Int. Cl.  
H03H 5/10        (2006.01)  
H02M 1/00        (2006.01)  
H03H 7/00        (2006.01)  
H01C 1/16        (2006.01)  
H01C 13/02       (2006.01)  
G01R 15/04       (2006.01)

(52) U.S. Cl.  
CPC . *H03H 7/00* (2013.01); *H01C 1/16* (2013.01); *H01C 13/02* (2013.01); *G01R 15/04* (2013.01)

USPC .............................. 323/369; 363/146; 363/147

(58) Field of Classification Search  
USPC .................................... 323/369; 363/146, 147  
See application file for complete search history.

(56) References Cited

U.S. PATENT DOCUMENTS

| | | | | |
|---|---|---|---|---|
| 4,679,432 A | * | 7/1987 | Draeger | 73/295 |
| 5,942,960 A | * | 8/1999 | Schiltmans et al. | 333/247 |
| 6,595,065 B2 | * | 7/2003 | Tanizawa et al. | 73/720 |
| 2009/0139984 A1 | * | 6/2009 | Sherrill et al. | 219/532 |

FOREIGN PATENT DOCUMENTS

GB            1450697 A   *   9/1976

* cited by examiner

*Primary Examiner* — Emily P Pham  
(74) *Attorney, Agent, or Firm* — Cantor Colburn LLP

(57) ABSTRACT

The present invention relates to a resistive voltage divider comprising a plurality n of resistive elements in a configuration wherein the angles m=n−1 between each pair of elements are between 180° and 10°, characterized in that the group of elements is supported by a dielectric the shape of which is such that it allows the creepage distance of the divider to be equal to or longer than the sum of creepage distances of the individual resistances. This arrangement allows a correct insulation of the device because it maintains the outer insulation since in the event of short-circuit the current will flow through the resistances and not through the support.

3 Claims, 3 Drawing Sheets

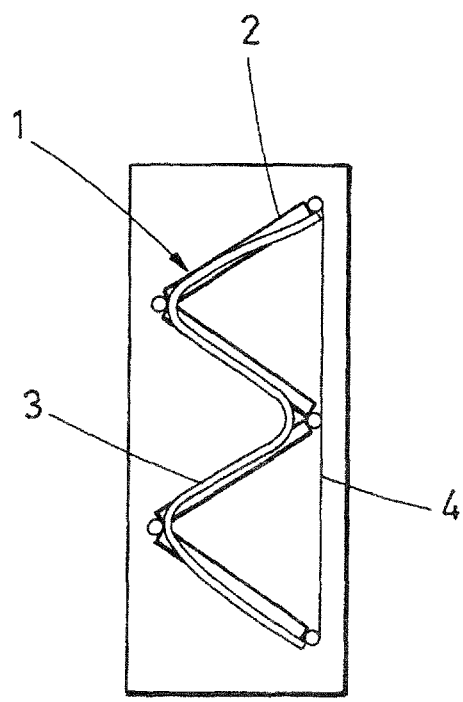 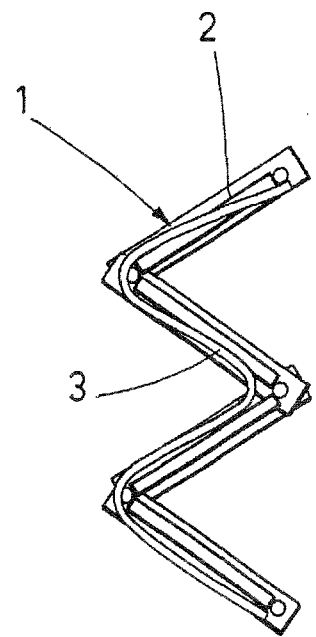
FIG.1
PRIOR ART
FIG.2

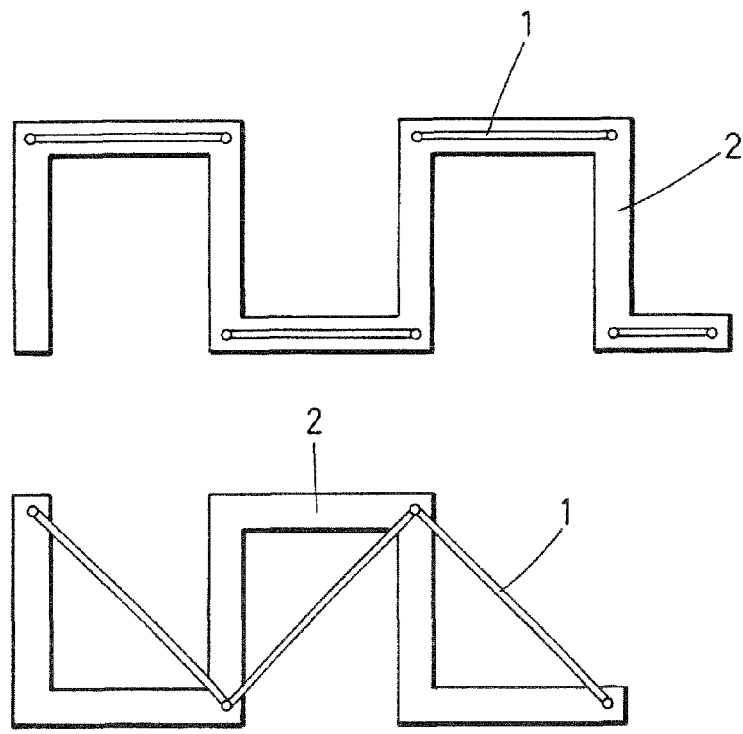
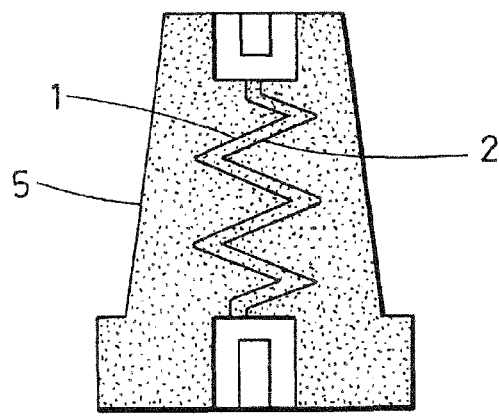
FIG.4
FIG.5

HIGH-VOLTAGE VOLTAGE DIVIDER AND CONNECTOR COMPRISING SAID DIVIDER

FIELD OF THE INVENTION

The present invention relates to a voltage divider and more particularly to a high-voltage resistive voltage divider. The divider can be housed inside a plug-in connector which can be plugged into a high-voltage power distribution cell.

BACKGROUND OF THE INVENTION

Voltage dividers are devices which allow converting a specific voltage applied to the high-voltage terminal into a lower voltage with a specific accuracy and transformation ratio, to thus enable having a proportional measurement of the voltage applied to the high-voltage terminal. The basic operation principle of the divider is connecting a series of impedances to the voltage of a system. Thus the voltage is distributed among the impedances of the device, each impedance supporting a part of the total voltage of the system, thus the voltage of one of the impedances is proportional to the total voltage applied to the device. A resistive divider is a special case where the impedances are purely resistive, but there are also capacitive dividers where the impedances are purely capacitive.

The geometric arrangement of the elements making up the resistive divider is a key factor in the divider measurement accuracy. Furthermore, taking into account that the device must withstand high voltages the required (internal and external) insulation is necessary for its proper operation.

For internal insulation it is necessary that each resistance internally supports the part of voltage that it will be subjected to, i.e., the sum of all resistances internally meets the insulation level needed for supporting all the voltage and preventing an internal short-circuit from occurring.

For an adequate external insulation it is necessary that each resistance is externally long enough so that an external insulation malfunction (short-circuit) does not occur, i.e., meeting the insulation distances or creepage distance suitable for the voltage to be supported. Creepage distance is defined as the shortest path that an electric current must travel across the outside of an electric device between the two ends (conductors) thereof. In the case of a divider, the creepage distance of each resistance and that of the assembly must be such that it supports the total voltage applied on the divider.

For many applications, the resistances cannot be aligned (the simplest divider), since the space available is insufficient. The resistances must therefore be placed forming angles between them.

OBJECT OF THE INVENTION

The object of the invention is to provide a voltage divider which is capable of space saving while at the same time assuring an optimum insulation and providing a stable accuracy. To that end, in a first aspect, the invention proposes a resistive voltage divider comprising a plurality n of resistive elements in a configuration wherein the angles m=n−1 between each pair of elements are between 180° and 10°, and wherein the group of elements is arranged on an insulating support the shape of which is such that the creepage distance of said support is equal to or longer than the sum of the creepage distances of the individual resistances.

The function of the support is to physically support the resistances achieving the condition of maintaining the geometric arrangement thereof constant and maintaining the length of the creepage distance or insulation distance of the complete divider such that there is no shortest path for the possible insulation malfunction across the outer surface of the support. The support can be a plate for printed circuit and is sinusoid-shaped, zig-zag-shaped or with ladder-shaped elements. In a second aspect, the invention proposes a plug-in connector which can be plugged into a terminal of a high-voltage system (for example, high-voltage power distribution cells) comprising a divider embedded in an insulating material (preferably a resin).

BRIEF DESCRIPTION OF THE DRAWINGS

For the purpose of aiding to better understand the features of the invention according to a preferred practical embodiment thereof, a set of drawings is attached to the following description in which the following has been depicted with an illustrative character:

FIG. 1 shows a divider with a continuous support according to the prior state of the art.

FIG. 2 shows a schematic view of the device of the invention.

FIG. 4 shows an alternative embodiment.

FIG. 5 shows in another aspect of the invention a plug-in connector with an embedded divider.

DETAILED DESCRIPTION OF THE INVENTION

Figure 3:
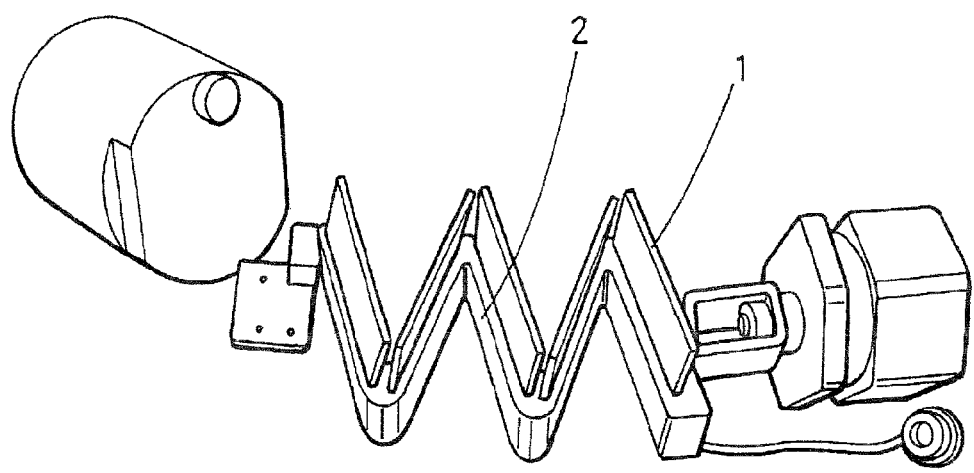
FIG. 3 shows a perspective view of the device of the invention.

Referring to FIG. 2 which shows a preferred example of the invention, the insulating support (2) can be made of plastic, glass or it can be made directly from a support for printed circuit (PCNB). The angle between resistances (1) will be comprised between 180° and 10° to assure a correct operation of the device, without short-circuits but allowing space saving. The support can be zig-zag-shaped or sinusoid-shaped, corresponding approximately to the shape of the continuous distance joining the resistances. It can also have the alternative shape of FIG. 4, with 90° ladder shaped elements.

The zig-zag arrangement, sinusoid arrangement or the like which follows the shape of the divider allows, in addition to a stable mechanical support, maintaining the length of the creepage distance (1) and insulation distance of the entire device within defined parameters, there being no shortest path for the possible insulation malfunction. Compared with FIG. 1, corresponding to a divider with continuous support according to the prior art. In this known divider, the creepage distance (4) is very much shorter than that in FIG. 2. It is seen in FIG. 2 that the creepage distance (3) corresponds with the distance joining the resistances following the position of the same, not the shortest distance between them, since there is air between the ends of the resistances.

The resistances are joined to the support by means of welded mechanical joints or with adhesive to assure accuracy in the respective positions. The creepage distance is similar or greater than the creepage distance of all the resistances involved in the composition of the entire resistance. The geometry is thus kept constant for assembling the resistances.

In a second aspect, the invention proposes a plug-in connector (FIG. 5) comprising the above voltage divider embedded in an insulating material (for example a resin) forming the body of the connector (5). The connector, as can be seen in FIG. 5, is preferably frustoconical shaped for connecting to a gas insulated high-voltage cell (generally SF6, sulfur hexafluoride). The connection can be made through a terminal made of flexible insulating material (such as silicon or EPDM) of a T-shaped connector socket coupled to the cell.

The connector in this setting meets the function of fixing each of the phases in the installation to the terminal, further allowing the measurement of the line voltage in that phase. Generally, the cells are three phase cells since they comprise three female terminals (one for each phase) and three plug-in connectors, each with its voltage divider.

The invention claimed is:

1. High-voltage resistive voltage divider comprising a plurality n of resistive elements (1) in a configuration wherein angles m=n−1 between each pair of said plurality n of resistive elements, are between 180° and 10°; and a group formed by said plurality n of resistive elements arranged on an insulating support (2), wherein said insulating support is formed in at least one of a sinusoidal shape, a zig-zag shape, and a ladder shape such that a creepage distance of said insulating support is equal to or longer than a sum of creepage distances of all individual resistive elements of said group.

2. The High-voltage resistive voltage divider according to claim 1, wherein the insulating support is a plate for printed circuits.

3. A Plug-in connector (5) for high-voltage power distribution cells comprising said high-voltage resistive voltage divider according to any of the preceding claims, said high-voltage resistive voltage divider embedded in an insulating material.

* * * * *